United States Patent [19]

Kim

[11] Patent Number: 5,403,767

[45] Date of Patent: Apr. 4, 1995

[54] METHODS FOR MANUFACTURING A STORAGE ELECTRODE OF DRAM CELLS

[75] Inventor: Jae-Kap Kim, Kyoungki, Rep. of Korea

[73] Assignee: Hyundai Electronics Industries Co., Ltd., Kyoungki-do, Rep. of Korea

[21] Appl. No.: 998,512

[22] Filed: Dec. 30, 1992

[30] Foreign Application Priority Data

Dec. 31, 1991 [KR] Rep. of Korea ............... 91-25619

[51] Int. Cl.6 ............................................. H01L 27/108
[52] U.S. Cl. ............................................. 437/52; 437/47; 437/48; 437/60; 437/919
[58] Field of Search .................... 437/47, 48, 52, 60, 437/919

[56] References Cited

U.S. PATENT DOCUMENTS

| | | | |
|---|---|---|---|
| 5,084,405 | 1/1992 | Fazan et al. | 437/52 |
| 5,185,282 | 2/1993 | Lee et al. | 437/47 |
| 5,266,512 | 11/1993 | Kirsch | 437/60 |

FOREIGN PATENT DOCUMENTS 0091957  4/1991  Japan ............................ 437/52

*Primary Examiner*—Tom Thomas
*Attorney, Agent, or Firm*—Merchant, Gould, Smith, Edell, Welter & Schmidt

[57] ABSTRACT

A method for manufacturing a storage electrode of DRAM cells having a higher degree of integration in which the space between neighboring storage electrodes is made narrower than that obtainable by conventional lithographic techniques. The storage electrode is formed with a cylindrical, dual cylindrical, or jar-shaped structure to obtain a large surface area, and thus a high-capacitance.

5 Claims, 4 Drawing Sheets

METHODS FOR MANUFACTURING A STORAGE ELECTRODE OF DRAM CELLS

BACKGROUND OF THE INVENTION

The present invention relates to a method for manufacturing a storage electrode of DRAM cells of a semiconductor memory device. Particularly, this invention relates to a method for manufacturing storage electrodes which have a narrower space therebetween than that currently obtainable by conventional lithographic techniques so as to have a higher degree of integration of DRAM cells, and further for manufacturing the storage electrodes having a cylindrical, dual cylindrical, or jar structure for obtaining a large surface area.

Following the trend of a higher degree of integration of DRAM cells, the area of a capacitor is decreased by decreasing the area of the unit cell so that the capacitor is maintained below the required value. Therefore, a study to increase the capacitance of the capacitor has been continued.

SUMMARY OF THE INVENTION

It is one object of this invention to provide a method for forming the space between the most neighboring storage electrodes which is narrower than the minimum line width currently available using a lithographic technique thereby obtaining a higher degree of integration of DRAM cells. More specifically, after a storage electrode mask is formed with the minimum separation through the lithographic technique, the space between neighboring storage electrodes is further minimized during the process forming a first insulating film pattern.

It is another object of this invention to provide a method for increasing the capacitance of the capacitor by maximizing the surface area of the storage electrode.

There are three factors in increasing the surface area of the storage electrode according to the present invention. One factor is to form the storage electrode and a second, cylinder-shaped, storage electrode where the first storage electrode is in contact with the second, cylinder-shaped, storage electrode.

Second, the storage electrode is formed with a dual cylindrical structure. In the third factor, the storage electrode is formed with a jar structure. From the above three factors, the surface area of the storage electrode is maximized so that greater capacitance of the capacitor is obtained.

DETAILED DESCRIPTION OF THE PREFERRED EMBODIMENTS

Figure 1A:
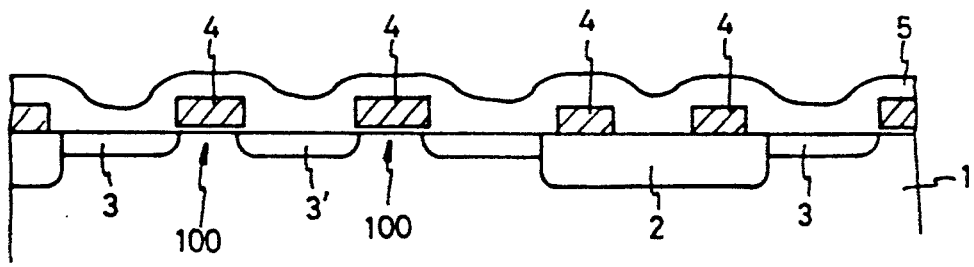
FIGS. 1A–1F are vertical cross-sectional views which illustrate manufacturing steps of the storage electrode of DRAM cells according to the second embodiment of the present invention.

The present invention will now be described in detail with reference to the accompanying drawings.

It should be noted that, after formation of the MOSFET and before formation of a stack capacitor, a bit line contact with the drain of the MOSFET is not shown in the drawings. FIGS. 1A–1F are cross sectional views which illustrate manufacturing steps of the storage electrode of DRAM cells according to a first embodiment of the present invention.

Referring to FIG. 1A, an insulating film 2 is formed on a semiconductor substrate 1, and a MOSFET 100 having a gate electrode 4, source electrode 3, and drain electrode 3' is formed. An interlayer oxide 5 is then formed over the entire exposed surface. Although not indicated in FIG. 1A, after the drain electrode 3' is exposed by removing selectively the interlayer oxide 5, a bit line contact with the drain electrode 3' is formed and its upper portion is coated with the insulating film.

Figure 1B:
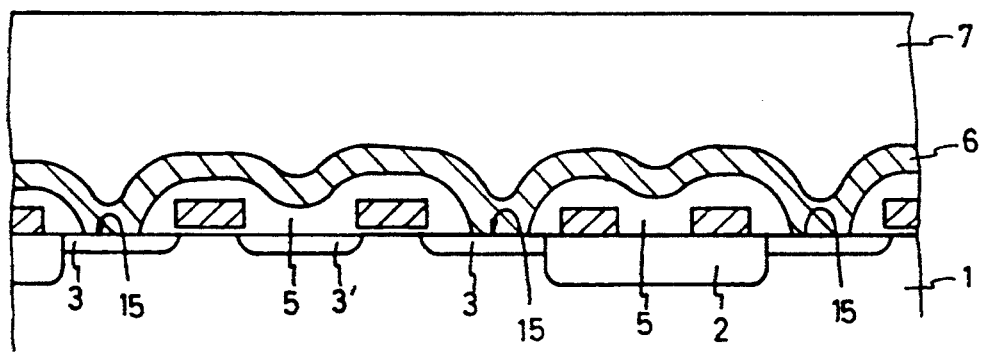

As shown in FIG. 1B, a contact hole 15 which exposes the source electrode 3 is formed by removing a portion of the above interlayer oxide 5. A first conductive layer 6, made of a polysilicon film, for a first storage electrode is then deposited on the entire upper surface of the device so that the first conductive layer 6 is in contact with the source electrode 3. Further, a first insulating film 7, made of an oxide film, is formed over the first conductive layer 6 at a predetermined thickness substantially equal to the height of proposed cylinder-shaped storage electrodes.

Figure 1C:
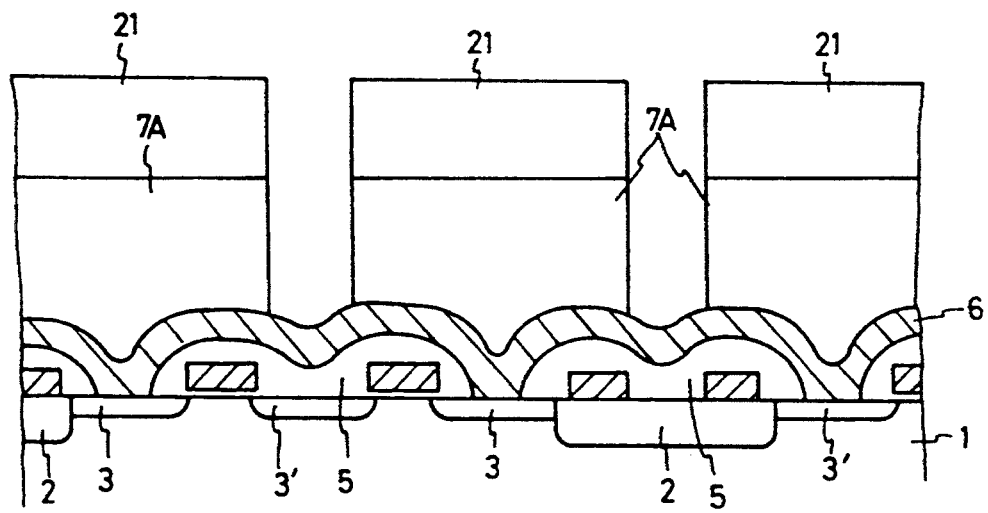
Figure 1D:
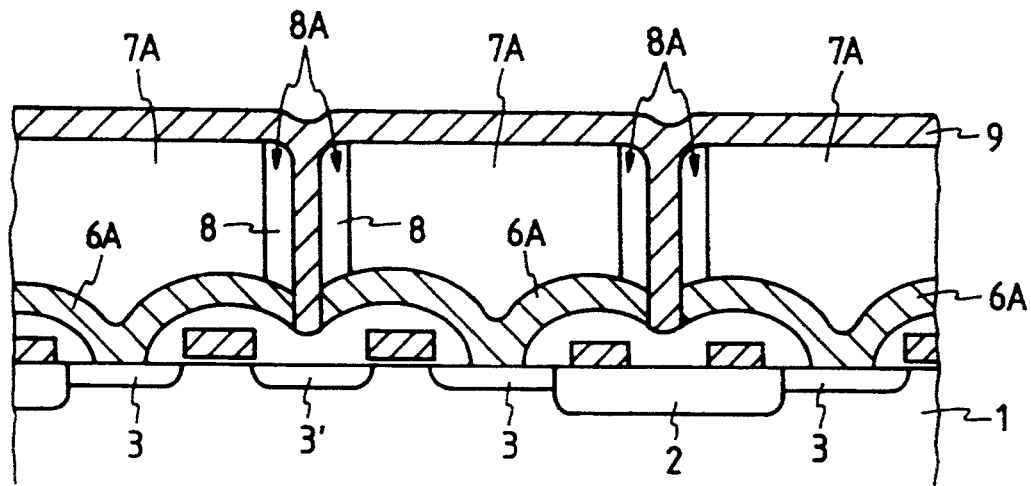

FIG. 1C is a cross sectional view showing a photoresist film pattern 21 used as a storage electrode mask and a first insulating pattern 7A of a right cylindrical structure after an exposed portion of the insulating film 7 is etched out. The first insulating film pattern 7A corresponds with the pattern of the previously formed source electrode 3, and the space formed between each neighboring element of the insulating film pattern 7A is equal to the minimum line width possible using a lithographic technique. As shown in FIG. 1D, after removing the photoresist film pattern 21, a second insulating film 8 of fixed thickness, made of an oxide film, is deposited on the entire surface of the device. A second insulating film spacer 8A having a cylindrical form is formed on the sidewall of the first insulating pattern 7A by an etching process which exposes the upper surface of the first insulating pattern 7A. Etching out the exposed conductive layer 6 by using the first insulating film pattern 7A and the second insulating film spacer 8A as a mask, a plate-shaped first storage electrode 6A in contact with the source electrode 3 is formed. An etching barrier layer 9 of predetermined thickness, made of a nitride film, is deposited on the upper surface of the first insulating pattern 7A and also fills the space between the second insulating film spacers 8A.

An important fact that demands special attention is that the space between adjacent second insulating film spacers 8A is minimized by the previously mentioned lithographic technique.

Figure 1E:
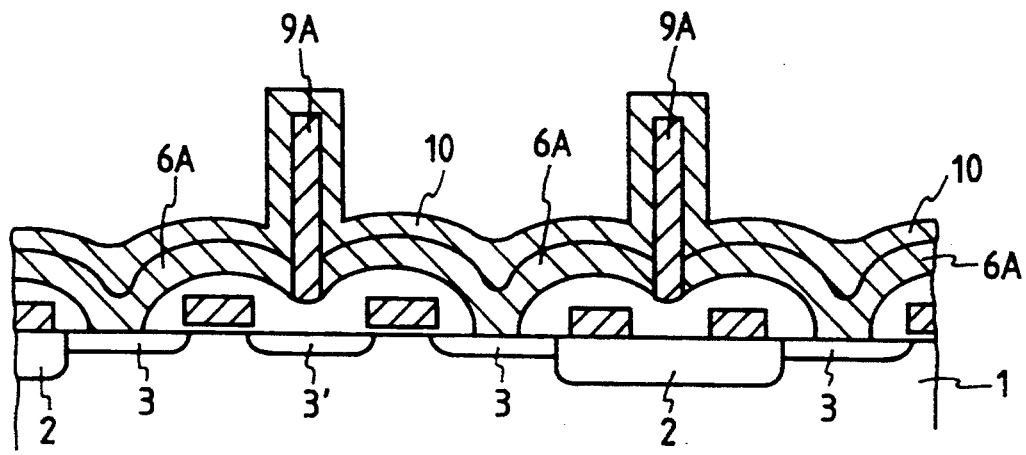
Figure 1F:
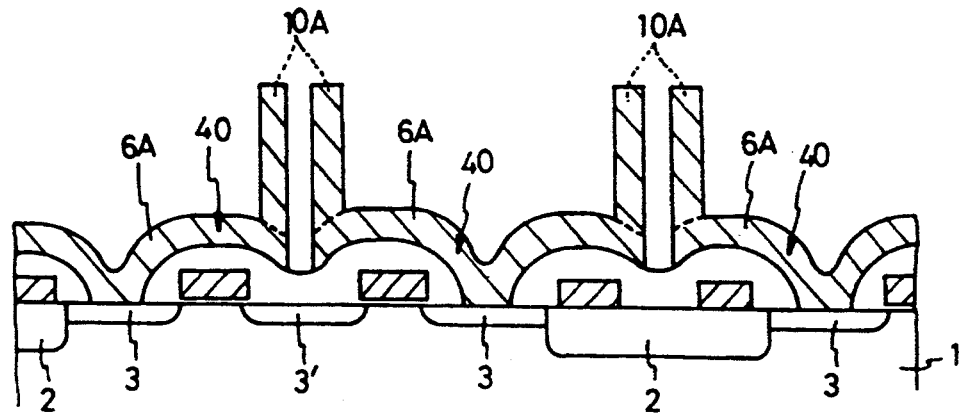

Referring to FIG. 1E, a portion of the etching barrier layer 9 is removed by an etch back process until the upper surface of the first insulating film pattern 7A is exposed so that an etching barrier layer pattern 9A remains between the second insulating film spacers 8A. Then the first insulating film pattern 7A and the second insulating film spacer 8A are entirely removed and a second conductive layer 10 for a second storage electrode is deposited on the exposed surface of the first storage electrode 6A and the etching barrier layer pattern 9A. After that, as shown in FIG. 1F, a portion of the second conductive layer 10 on an upper surface of the etching barrier layer pattern 9A is etched using blanket etching or an etch back process until the upper surface of the etching barrier layer pattern 9A is exposed. The remaining portion of the second conductive layer 10 defines a second storage electrode 10A having an outer wall in the shape of an upright, open cylinder. The remaining cylinder-shaped etching barrier layer pattern 9A is removed. The second storage electrode 10A is in contact with the edge portion of the first storage electrode 6A, resulting in a single storage electrode 40 in contact with the source electrode and having a cylindrical storage portion. The above blanket etching process of the second conductive layer 10 serves to etch only the thickness of the second conductive layer 10 deposited over the upper portion of the etching barrier layer pattern 9A; however, some surfaces of the first storage electrode 6A may be etched. As a safeguard, a photoresist film may be coated on the upper surface of the second conductive layer 10 before etching, after which the above etch back process of the second conductive layer 10 is used to etch the photoresist film and the second conductive layer 10 until the upper portion of the etching barrier layer 9A is exposed by 1:1 etching selection ratio of the photoresist film to the conductive layer 10.

Figure 2A:
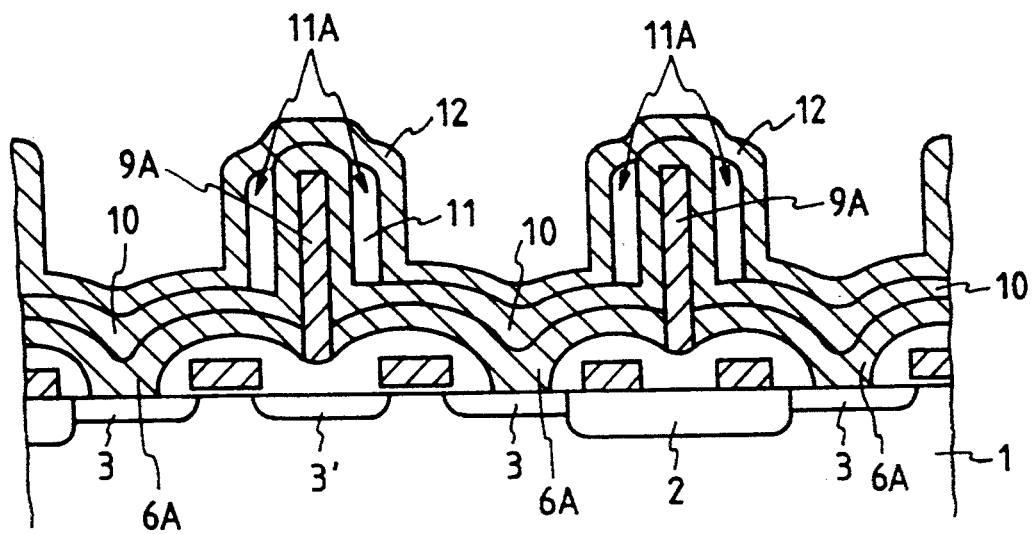
FIGS. 2A–2C are vertical cross-sectional views which illustrate manufacturing steps of the storage electrode of DRAM cells according to the second embodiment of the present invention.
Figure 2B:
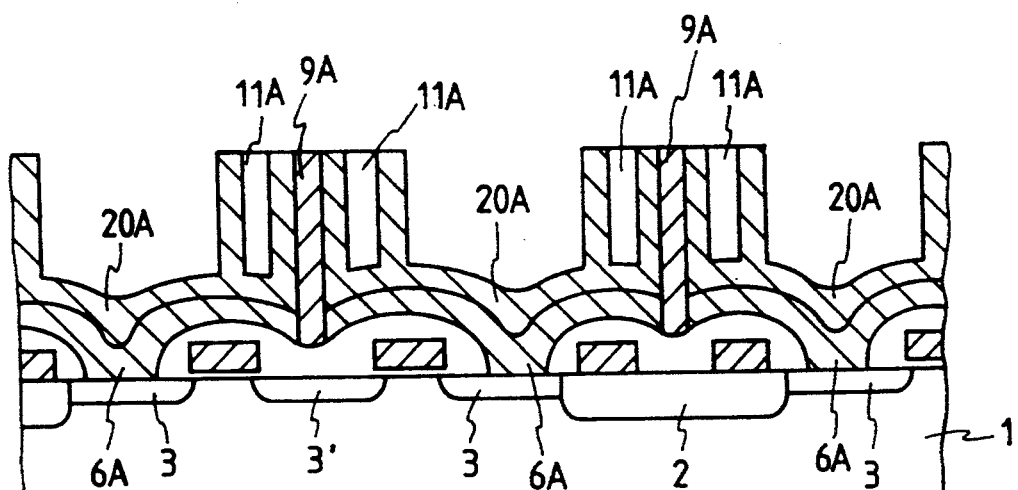
Figure 2C:
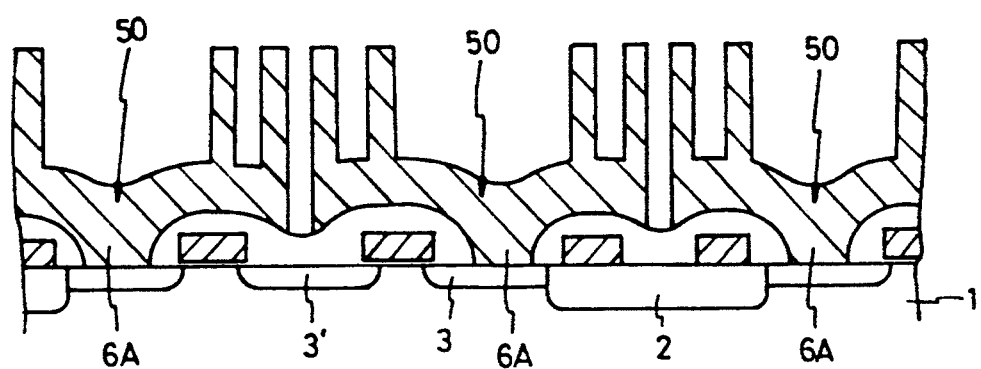

FIGS. 2A–2C are cross sectional views illustrating a dual cylinder-shaped storage electrode of DRAM cells according to the second embodiment of the present invention, and the manufacturing steps leading up to FIG. 2A are the same as those describing the manufacturing process of FIGS. 1A–1E.

As shown in FIG. 2A, which is the next step after arriving at the structure of FIG. 1E, a fixed thickness of a third insulating film 11, made of a oxide film, is deposited on an upper surface of the second conductive layer 10, and it is etched without a mask using an anisotropic etching process so that a third film spacer 11A is formed at the sidewall of the cylinder-shaped second conductive layer 10. Further, a third conductive layer 12 for a third storage electrode is deposited along the entire exposed surface of the device. An important fact that demands special attention is that, before depositing the third insulating film 11, the third insulating film spacer 11A may be formed at the sidewall of the etching barrier layer pattern 9A by employing an etch back technique removing the second conductive layer 10 until an upper surface of the etching barrier layer pattern 9A is exposed.

Referring to FIG. 2B, the second and third conductive layers 10, 12 are etched by the blanket etching or etch back process of the first embodiment until the upper surface of the etching barrier layer pattern 9A is exposed so that a dual cylinder-shaped second storage electrode 20A is formed.

FIG. 2C is a cross sectional view showing a storage electrode 50 defined by the combination of the above second storage electrode 20A and the first storage electrode 6A after removal of the third insulating film spacer 11A and the etching barrier layer pattern 9A. The storage electrode 50 formed by the second embodiment of the present invention is formed with a dual cylindrical structure so that the surface area of the storage electrode is increased.

Figure 3A:
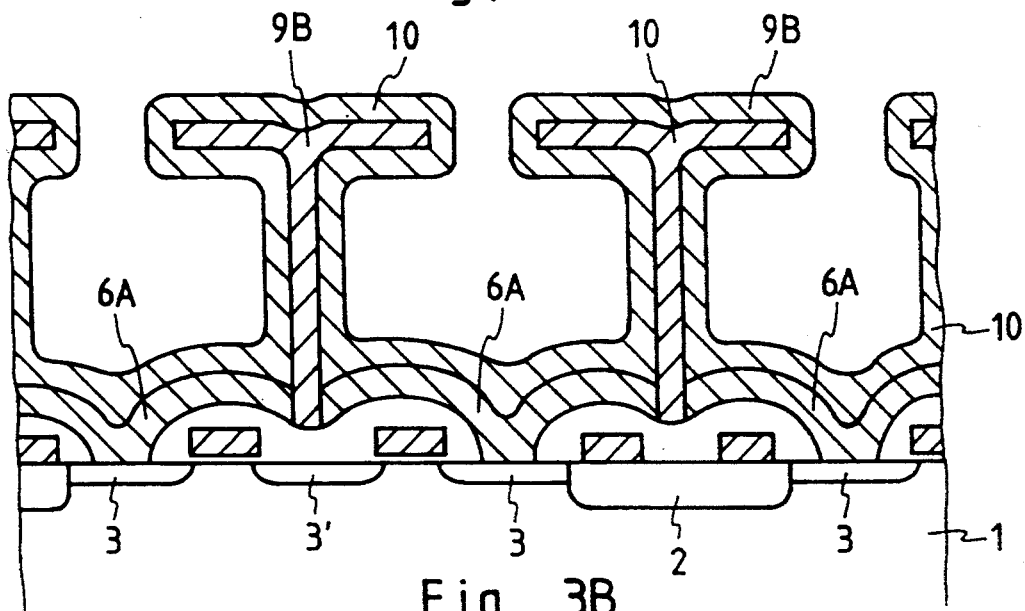
FIGS. 3A–3C are vertical cross-sectional views which illustrate manufacturing steps of the storage electrode of DRAM cells according to the third embodiment of the present invention.
Figure 3B:
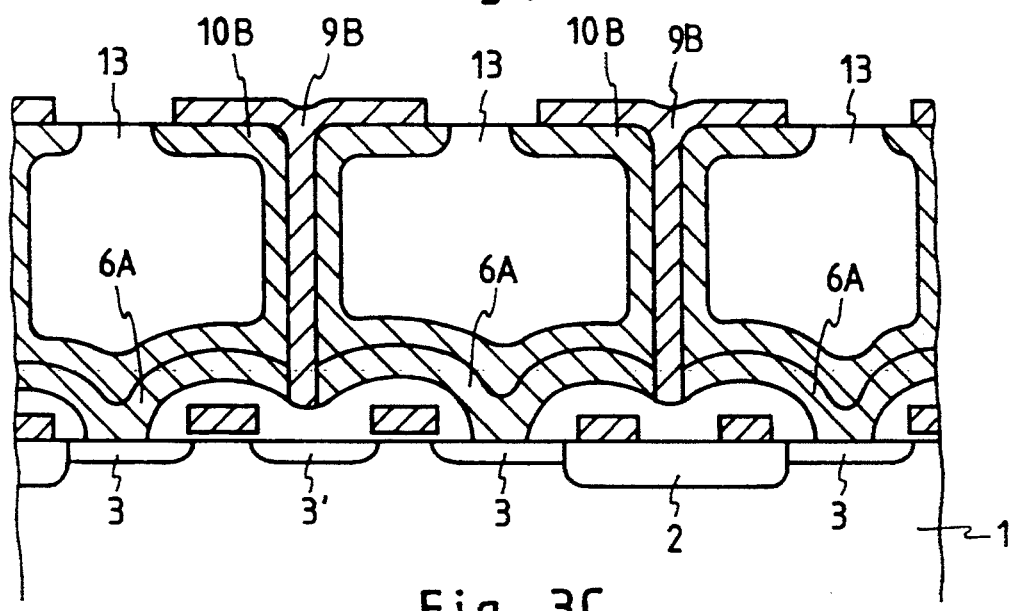
Figure 3C:
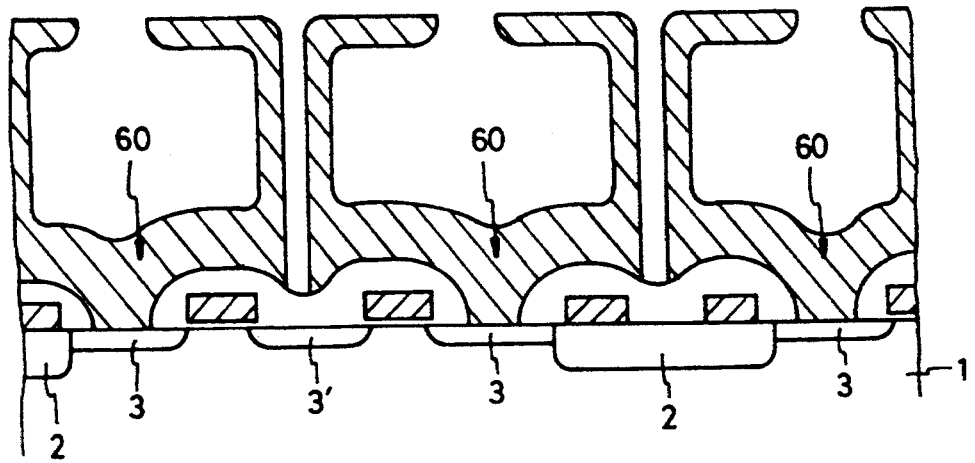

FIGS. 3A–3C are cross sectional views which illustrate formation of a storage electrode of DRAM cells according to a third embodiment of the present invention, and the manufacturing steps begin at FIG. 3A after going through the same manufacturing process as shown in FIGS. 1A–1D.

As shown in FIG. 3A, which is the next step after arriving at the structure of FIG. 1D, using a predetermined mask (not illustrated), the etching barrier layer pattern 9B is formed by etching selectively the etching barrier layer 9 of the upper part of the source electrode. The first insulating layer pattern 7A and the second insulating spacer 8A are then completely removed.

After that, a second conductive layer 10 for a second storage electrode is deposited along the entire surface of the first storage electrode 6A and the etching barrier layer pattern 9B.

Referring to FIG. 3B, after coating the upper surface of the device with a photoresist film 13 at a thickness greater than the upper surface layer of the second conductive layer 10, the photoresist film 13 and the second conductive layer 10 are etched by a 1:1 etching selection ratio of the photoresist film 13 to the second conductive layer 10. After exposing the upper surface of the etching barrier layer pattern 9B, a jar-shaped second storage electrode 10B is formed by accomplishing an over-etch.

FIG. 3C is a cross sectional view which illustrates the formation of a storage electrode 60 having a jar structure defined by the combination of the first and the second storage electrodes 6A, 10B after removing the remaining photoresist film 13 and the etching barrier layer pattern 9B. Although the third embodiment of the present invention compared with the first embodiment adds a masking process, the surface area of the storage electrode is increased by forming the disclosed jar-shaped storage electrode having a narrow entrance and a broad interior. As has been described heretofore, according to the first, second, and third embodiment of the present invention, the minimized space between storage electrodes of the neighboring capacitor of unit cell contributes to a higher degree of integration, and the surface area of the storage electrode is maximized so that the capacitance of a capacitor in a small area is fully increased.

Although the present invention has been described and illustrated in detail, it is to be clearly understood that the same is by way of illustration and example only, and is not to be taken by means of limitation, the spirit and scope of the present invention being limited only by the terms of the appended claims.

What is claimed:

1. A method for manufacturing a storage electrode of DRAM cells having cylindrical storage electrodes which are adjacent to neighboring electrodes, comprising the steps of:
  (a) forming a plurality of active regions in a semiconductor substrate each comprising a gate electrode, a source electrode, and a drain electrode;
  (b) forming insulating layers in portions of said substrate to separate each of said active regions from adjacent active regions;
  (c) forming an interlayer oxide over all exposed surfaces of said active regions, said insulating layers, and said substrate;
  (d) forming a contact hole at each of said active regions by selectively removing a portion of said interlayer oxide to expose only said source electrode;

(e) depositing a first conductive layer over said interlayer oxide and in contact with each said exposed source electrode through each said contact hole such that each said source electrode is connected to the other said source electrodes, said first conductive layer forming a first storage electrode contacted by said source electrode;

(f) depositing a first insulating film over said first conductive layer at a thickness equal to a pre-determined height of the desired cylindrical storage electrode;

(g) forming a photo mask on said first insulating film and etching through said first insulating film to said first conductive layer such that a cylindrical hole is formed in said first insulating film for each said source electrode;

(h) removing said photo mask;

(i) depositing a second insulating film over said first insulating film and into said cylindrical hole such that said cylindrical hole is filled with said second insulating film;

(j) etching said second insulating film such that the upper surface of said first insulating film is exposed and such that an axial portion of said second insulating film in said cylindrical hole is etched away to leave a cylindrical second insulating film spacer in contact with the inner wall of said cylindrical hole of said first insulating film, said first conductive layer being exposed at a bottom end of said spacer;

(k) etching through said first conductive layer at the bottom end of said spacer to expose said interlayer oxide using said first insulating film and said spacer as a mask to prevent etching of any other portion of said first conductive layer;

(l) depositing an etching barrier layer over the exposed upper surface of said first insulating film and filling said cylindrical spacer to form a cylindrical etching barrier layer within said spacer;

(m) blanket etching said etching barrier layer to expose the upper surface of said first insulating film;

(n) removing said first insulating layer and said spacer using an etch back process to expose said first conductive layer and said remaining cylindrical etching barrier layer;

(o) uniformly depositing a second conductive layer over said first conductive layer and said cylindrical etching barrier layer;

(p) blanket etching said second conductive layer to expose an upper surface of said cylindrical etching barrier layer; said second conductive layer remaining on said cylindrical etching barrier layer defining a second storage electrode in the form of an upright cylinder; and (q) etching away said remaining cylindrical etching barrier layer from within said second storage electrode, leaving a hollow, cylindrical second storage electrode in contact with said first storage electrode.

2. A method for manufacturing a storage electrode of DRAM cells as claimed in claim 1, wherein the photo mask in step (g) is formed using a lithographic technique so that the space between adjacent second storage electrodes is minimized.

3. A method for manufacturing a storage electrode of DRAM cells as claimed in claim 1, wherein a photoresist film is deposited on an upper surface of said second conductive layer before step (p), and in step (p) said photoresist film and said second conductive layer are then etched by a one-to-one etching selection ratio until the upper surface of said etching barrier layer is exposed, and said photoresist film is then removed.

4. A method for manufacturing a storage electrode of DRAM cells as claimed in claim 1, wherein said etching barrier layer is formed with a nitride film.

5. A method for manufacturing a storage electrode of DRAM cells as claimed in claim 1, wherein said first and second insulating films are formed with an oxide film.

* * * * *

UNITED STATES PATENT AND TRADEMARK OFFICE
CERTIFICATE OF CORRECTION

PATENT NO. : 5,403,767

DATED : April 4, 1995

INVENTOR(S) : Jae-Kap Kim

It is certified that error appears in the above-identified patent and that said Letters Patent is hereby corrected as shown below:

In Column 5, lines 22-24, Claim 1, delete "such that said cylindrical hole is filled with said second insulating film" after the word "hole".

Signed and Sealed this

Twelfth Day of December, 1995

Attest:

BRUCE LEHMAN

Attesting Officer     Commissioner of Patents and Trademarks